(12) United States Patent
Gorshe

(10) Patent No.: US 7,426,679 B2
(45) Date of Patent: Sep. 16, 2008

(54) CYCLIC REDUNDANCY CHECK CIRCUIT FOR USE WITH SELF-SYNCHRONOUS SCRAMBLERS

(75) Inventor: Steven Scott Gorshe, Portland, OR (US)

(73) Assignee: PMC-Sierra, Inc., Santa Clara, CA (US)

( * ) Notice: Subject to any disclaimer, the term of this patent is extended or adjusted under 35 U.S.C. 154(b) by 368 days.

(21) Appl. No.: 11/167,109

(22) Filed: Jun. 28, 2005

(65) Prior Publication Data

US 2005/0257113 A1 Nov. 17, 2005

Related U.S. Application Data

(62) Division of application No. 10/147,880, filed on May 20, 2002, now abandoned.

(51) Int. Cl.
*H03M 13/00* (2006.01)

(52) U.S. Cl. .................. 714/785; 714/758

(58) Field of Classification Search .......... 714/758, 714/785
See application file for complete search history.

(56) References Cited

U.S. PATENT DOCUMENTS

| | | | | | |
|---|---|---|---|---|---|
| 4,872,157 | A | * | 10/1989 | Hemmady et al. | 370/400 |
| 5,012,459 | A | * | 4/1991 | Odaka et al. | 360/32 |
| 5,237,593 | A | * | 8/1993 | Fisher et al. | 375/367 |
| 5,321,754 | A | * | 6/1994 | Fisher et al. | 380/268 |
| 5,703,882 | A | * | 12/1997 | Jung et al. | 370/474 |
| 6,006,321 | A | * | 12/1999 | Abbott | 714/43 |
| 6,304,987 | B1 | * | 10/2001 | Whetsel, Jr. | 714/724 |
| 6,349,138 | B1 | * | 2/2002 | Doshi et al. | 380/200 |
| 6,438,724 | B1 | * | 8/2002 | Cox et al. | 714/758 |
| 6,446,234 | B1 | * | 9/2002 | Cox et al. | 714/758 |
| 6,609,226 | B1 | | 8/2003 | Figueira | |
| 6,647,518 | B1 | * | 11/2003 | Asmanis | 714/707 |
| 6,775,302 | B1 | * | 8/2004 | Shaffer et al. | 370/518 |
| 6,820,230 | B2 | | 11/2004 | Sweeney | |
| 6,851,086 | B2 | * | 2/2005 | Szymanski | 714/781 |

OTHER PUBLICATIONS

S. Wicker, "Error Control Systems for Digital Communication and Storage"—Upper Salle River, N.J.: Prentice Hall, 1995, pp. 121.
T1X1.5/2001-094 "Impact of $x^{43}$ + 1 Scrambler on the Error Detection Capabilities of the Ethernet CRC", Norival Figueira, Nortel Networks, Mar. 2001.
"Analysis of the Interaction Between CRC Error Detecting Polynomials and Self-Synchronous Payload Scramblers"—Steven S. Gorshe.

* cited by examiner

*Primary Examiner*—Mujtaba K. Chaudry
(74) *Attorney, Agent, or Firm*—Borden Ladner Gervais LLP

(57) ABSTRACT

The present invention provides a circuit for detecting and correcting errors in a bit stream. At least two logic gates receive inputs from a plurality of circuit elements. The plurality of circuit elements are coupled to receive and store a portion of a bit stream. At the end of a CRC error detection division operation, each circuit element corresponds to a bit in a bit error pattern syndrome and the logic gates determine if the contents of the circuit elements match specific bit error patterns. The circuit causes the state of at least one bit in the bit stream to change if the contents of the plurality of circuit elements match one of the specific bit patterns. The circuit is advantageous in that it may detect single bit errors, and double bit errors that may be caused by error duplication characteristic of a scrambler.

58 Claims, 5 Drawing Sheets

EXAMPLE FOR
G(X) = X16+X15+X14+X12+X10+X8+X7+X4+X3+X+1

CYCLIC REDUNDANCY CHECK CIRCUIT FOR USE WITH SELF-SYNCHRONOUS SCRAMBLERS

CROSS REFERENCE TO RELATED APPLICATIONS

This application is a divisional of U.S. patent application, now abandoned Ser. No. 10/147,880, filed on May 20, 2002, the contents of which are incorporated herein by reference.

FIELD OF INVENTION

This invention relates to the error detection and correction by a 16-bit Cyclic Redundancy Check (CRC-16) generation circuit.

BACKGROUND TO THE INVENTION

Cyclic Redundancy Check (CRC) is an important aspect in the error-detecting capabilities of many protocols, such as the Ethernet local area network, protocol. CRC provides a number of bits (usually 16 or 32) generated from, and appended to the end of, a block of data to provide error detection. A message receiver generates a CRC from the block of data and compares it to the CRC appended to the received message. If the appended CRC matches the generated CRC, then there is a high probability that the received message has not been corrupted.

One standard 16-bit generator polynomial is represented by $x^{16}+x^{12}+x^5+1$. The polynomial represents the binary number 10001000000100001—a one bit is in positions 16, 12, 5, and 0. The CRC is the remainder after binary (modulo 2) division of the message by the generator polynomial. For Ethernet CRC, the 32-bit generator polynomial is represented by $x^{32}+x^{26}+x^{23}+x^{22}+x^{16}+x^{12}+x^{11}+x^{10}+x^8+x^7+x^5+x^4+x^2+x+1$. Typically, a 16-bit CRC generator polynomial is used with messages of less than 4 Kbytes. A 32-bit CRC generator is used for messages up to 64 kbytes in length.

The CRC is usually performed by the data link protocol and a calculated CRC is appended to the end of the data link layer frame. The CRC is calculated by performing a modulo 2 division of the data by a generator polynomial and recording the remainder after division.

Although this division may be performed in software, it is commonly performed using a shift register and exclusive or X-OR gates. The hardware solution for implementing a CRC is much simpler than a software approach. The CRC-16 is able to detect all single errors, all double errors, and all errors with bursts less than 16 bits in length. The previously-standardized CRC-16 generator polynomials can also detect all odd numbers of errors, at the expense of less detection capability for even numbers of errors.

On an aside, the CRC is the only field which is by convention sent most significant bit first. To further clarify, the first bit of the CRC-16 to be sent is the bit corresponding to position 16 in the CRC field, the most significant bit (MSB), and the last bit being the bit corresponding to position 0 in CRC field, the least significant bit (LSB).

As previously mentioned, CRC is pervasive throughout most data traffic. Recently, a protocol, known as the Generic Framing Procedure (GFP), utilizes a CRC-16 for error detection and correction in the frame header and payload. GFP also utilizes an $X^{43}+1$ slef-synchronous scrambler, for receiver synchronization protection. The GFP protocol has recently been standardized by the International Telecommunications Union—Telecommunications (ITU-T) as Recommendation G. 7041.

To date, GFP has been implemented as a generic mechanism to adapt traffic from higher-layer signals over a synchronous transport network. There are two types of GFP, the frame-mapped GFP and the transparent GFP. The frame-mapped GFP enables a signal frame to be received and mapped in its entirety into one or more GFP frames. The transparent GFP mapping involves decoding block-coded signal frames and then mapping the decoded signal frames into a fixed-length GFP frame, having only received a block-coded version of the signal frame.

Prior to transmitting a GFP frame, the payload portion of the GFP frame is normally scrambled. Frames are scrambled to protect a user from other malicious users who may try to cause loss of receiver synchronization at the physical layer. For the SONET/SDH protocol (Synchronous Optical Network/Synchronous Digital Hierarchy), self-synchronized scramblers are utilized to create more physical layer transitions to aid timing recovery at the receiver. The frame-synchronized scrambler was added to make it much more difficult for a malicious user to defeat the effects of the frame synchronous scrambler.

A frame-synchronized scrambler is one in which the transmitted data is exclusive-ORed bit-by-bit with the output of a pseudo-random sequence generator with the sequence generator being reset to a known state at the beginning of every frame. The frame-synchronized scramblers are very effective in increasing the transition density to an acceptable level for typical traffic. One drawback of a frame-synchronized scrambler is that it is a known, relatively short ($2^7$-1) pseudo-random sequence and it is possible for a malicious subscriber to attempt to mimic this pattern within the data he sends. The result is that if the subscriber data lines up with the SONET/SDH scrambler correctly, a long string can occur with no transitions, which in turn can cause the receiver to fail. The phenomenon was observed with early ATM and POS systems and was addressed from the outset with GFP. The solution used for each of these three protocols is a self-synchronous scrambler over the payload region of the cell/frame.

A self-synchronous scrambler is one in which the data is exclusive-ORed with a delayed version of itself on a bit-by-bit basis. The specific scrambler used for ATM, POS, and GFP exclusive-ORs the input data with scrambler output data after a 43 bit delay termed the scrambler polynomial. The descrambler reverses the process by multiplying the received signal by the same scrambler polynomial. The advantage to such a scrambler in this application is that it is very hard for a malicious user to duplicate due to its never having a known reset point. The value of the scrambler state is a function of the previous data rather than the position of the data within the SONET/SDH frame. The drawback to a self-synchronous scrambler is that any errors occurring on the transmission channel will be duplicated 43 bits later by the descrambler. As a result, an error check code over the data will have to deal with twice the bit error rate as that experienced by the transmission channel.

The duplicated bit error, hereinafter termed the "double bit error", requires that the decoded CRC detect the double bit errors, as well as any single bit errors, without compromising the probability of detection. In view of aforementioned shortcomings of the self-synchronous scrambler, the present invention seeks to provide a circuit for detecting and correcting both single bit errors and double bit errors based on a plurality of conditions being met. The present invention further seeks to provide a probability of error detection that is equivalent to the probability of error detection had the double errors not been introduced by the descrambler.

SUMMARY OF THE INVENTION

The present invention provides a circuit for detecting and correcting errors in a bit stream. The circuit consist of a plurality of circuit elements, an least operation circuit means, and at least two logic gates. The logic gates receive inputs from the plurality of circuit elements. The plurality of circuit elements are coupled to receive and store a portion of a bit stream. The operation circuit elements perform bitwise operations on the contents of at least two of the circuit elements. The bitwise operations are dictated by a CRC polynomial and are used to perform the CRC error detection division operation. At the end of the division process for the data to be checked, each circuit element corresponds to a bit in a bit error pattern syndrome, the logic gates determine if the contents of the circuit elements match specific bit error patterns. The circuit causes the state of at least one bit in the bit stream to change if the contents of the plurality of circuit elements match one of the specific bit patterns.

The present invention is advantageous in that it may detect single bit errors, and double bits errors which may be caused by error duplication characteristic of a scrambler. The circuit utilizes a minimum of logic gates, two AND gates to provide the error detection and correction not known in the prior art.

In a first aspect, the present invention provides a circuit for detecting and correcting errors in a bit stream, the circuit including at least two logical gates that determine if at least one of a plurality of conditions is present, each one of said plurality of conditions indicating at least one error in said bit stream and activating at least one of the at least two logical gates to change the state of a specific bit in said bit stream.

In a second aspect, the present invention provides a circuit for detecting and correcting errors in a bit stream, said circuit comprising:

- a plurality of bit circuit elements coupled to receive and store said bit stream, each bit circuit element corresponding to a specific bit in a bit pattern;
- at least one operation circuit element for performing operations between contents of at least two of said bit circuit elements; and
- at least two logic gates for determining if contents of said bit circuit elements match specific bit patterns at least one of said at least two logic gate receiving inputs from said bit circuit elements;
- wherein an output of said circuit causes a state of at least one bit in said bit stream to change if contents of said bit circuit elements match at least one of said plurality of specific bit patterns; and
- wherein said bit patterns correspond to errors that have occurred in the transmitted data.

In a third aspect, the present invention provides a circuit for detecting errors in a bit stream, the circuit comprising:

- operation means for performing bitwise operations between at least a portion of said bit stream and a bit pattern derived from said bit stream; and
- detection means for detecting if a bitwise operation between at least a portion of said bit stream and said bit pattern derived from said bit stream produces a result indicating at least one error in said bit stream;
- wherein said operation means implements a bitwise operation corresponding to.

$B(x)=\text{Rem}(D(x)/G(x))$ where $D(x)$ is said at least a first portion of said bit stream;

$G(x)$ is said bit pattern derived from said bit stream; and $B(x)$ is a remainder of a division operation between $D(x)$ and $G(x)$;

such that said detection means detects when $B(x)$ does not equal 0.

BRIEF DESCRIPTION OF THE DRAWINGS

The present invention will now be described with reference to the drawings, in which.

DETAILED DESCRIPTION

Figure 1:
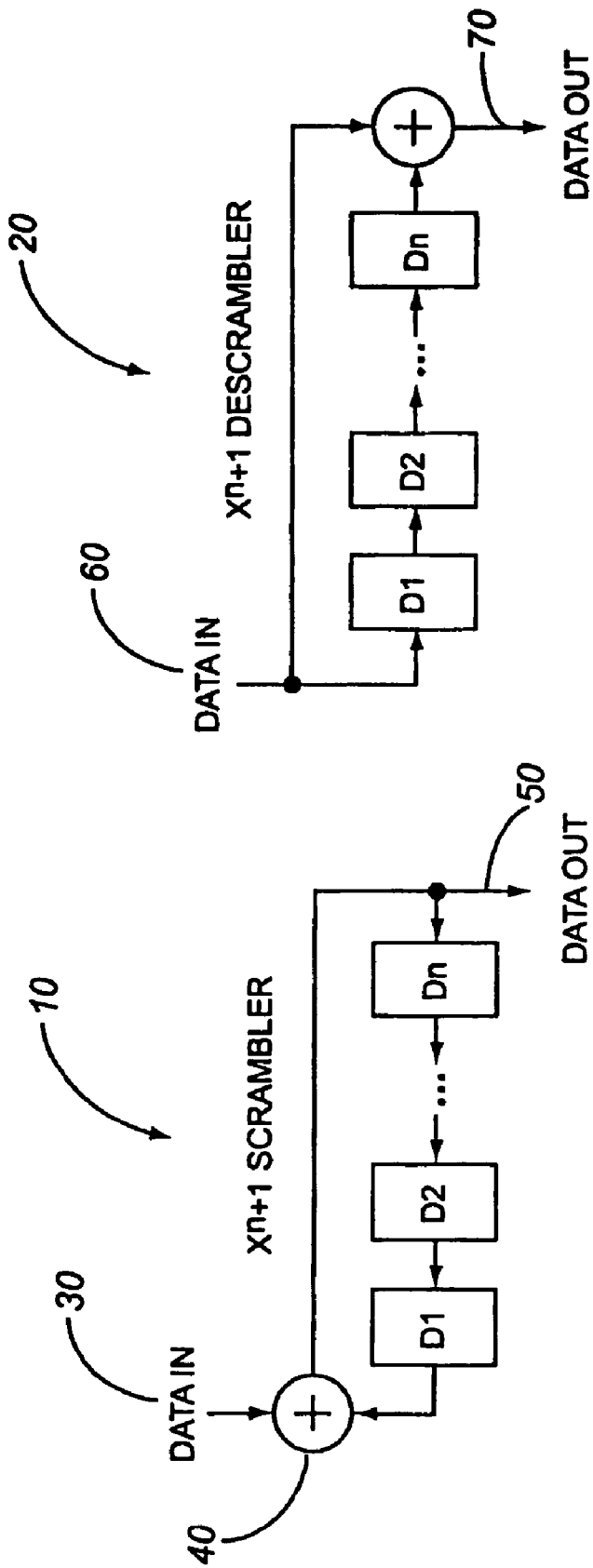
FIG. 1 illustrates a known self-synchronous scrambler and descrambler.

FIG. 1 illustrates both a $x^n+1$ self-synchronous scrambler 10 and descrambler 20 as discussed in the background to the invention. As previously explained, the $x^n+1$ scrambler 10 receives data in the form of a bit stream at the input 30. The data is exclusive-ORed 40 with a delayed version of itself. The delayed bits are illustrated as bit circuit elements, D1, D2, . . . . Dn. The scrambled data is output at 50 by the exclusive-OR operation after an n-bit delay. The scrambler operation is expressed as an $x^n+1$ polynomial.

In FIG. 1, the $x^n+1$ descrambler 20 performs the reverse operation from the scrambler 20. The descrambler 20 multiplies the received data at the input 60 by the same scrambler polynomial. The descrambler outputs the descrambled data 70 serially after the first set of n bits have been received.

Figure 2:
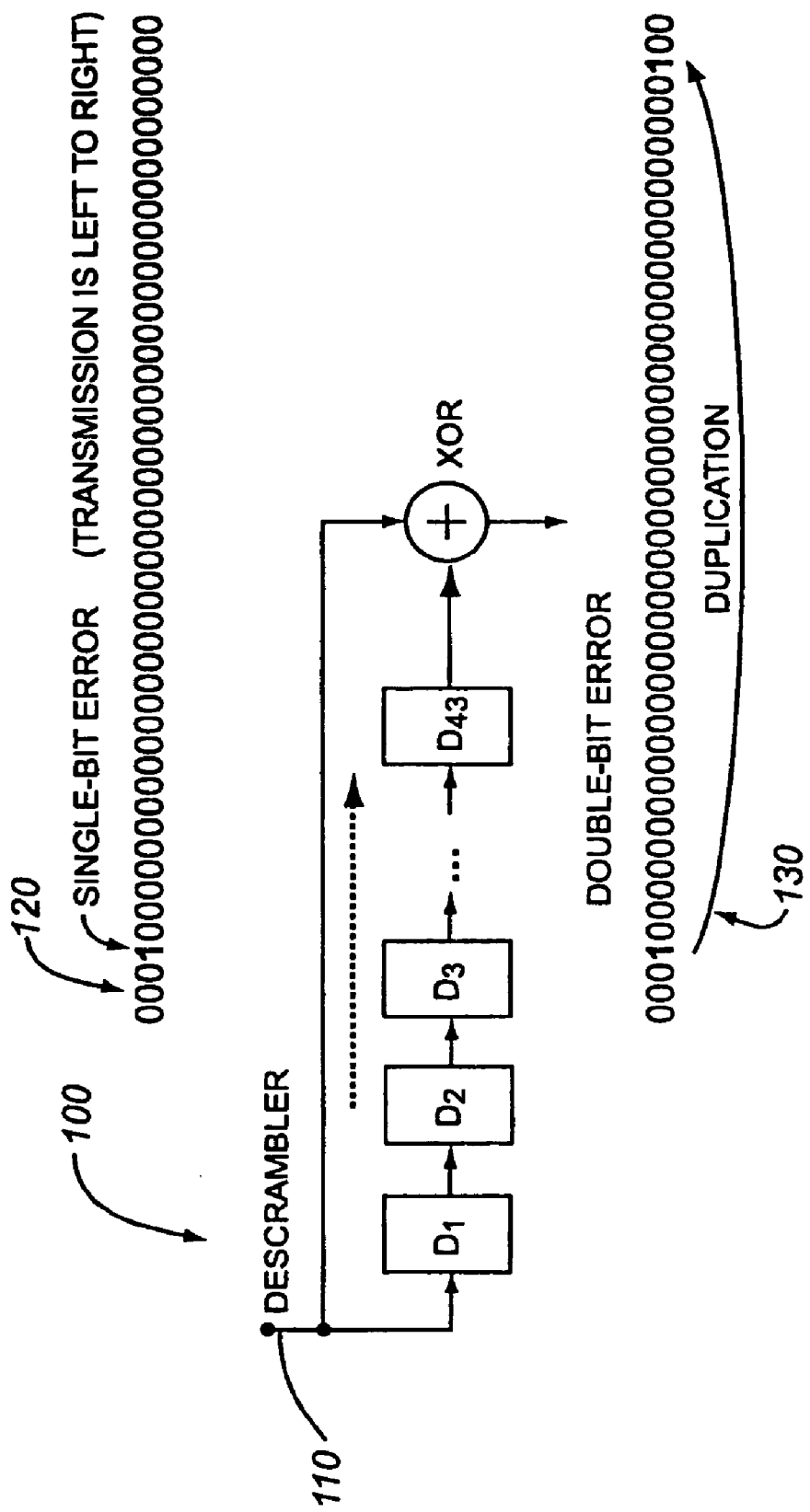
FIG. 2 illustrates a known $x^{43}+1$ self-synchronous scrambler.

FIG. 2 illustrates a $x^{43}+1$ self-sychronous scrambler 100 of the prior art. As shown in the $x^n+1$ descrambler of FIG. 1, the $x^{43}+1$ self-sychronous scrambler 100 multiplies the received input bit stream by the scrambler polynomial, $x^{43}+1$. The drawback of the self-sychronous scrambler, in general, is that any errors occurring on the transmission channel will be duplicated n bits later in the bit stream. In the case of the $x^{43}+1$ self-sychronous scrambler, any errors are duplicated 43 bits later by the descrambler 100. A single-bit error is illustrated in a possible output bit stream 120, whereas a double-bit error is shown in another possible output bit stream 130. While the descrambler 100 does duplicate any bit errors, a double bit error may not be output within the same data block, or data frame, of descrambled bits. In other words, the first error may be in a preceding data block while the double error is part of the next data block. Furthermore, while it is possible to have double bit errors within a common data block, it is further possible to have triple errors due to bit error placement within the data block. To clarify, in a given data block there may be an error and a duplicate error and in addition, another bit error may occur due to boundary cases. Boundary cases involve triple bit errors from a preceding or successive block, where bit errors from a preceding block are extend across frames into a preceding/successive block. These triple errors, while random, are detectable by the CRC-16.

Accordingly, the present invention provides a circuit for implementing a CRC-16 polynomial for triple bit error detection with improved single bit error and double bit error detection after descrambling.

Figure 3:
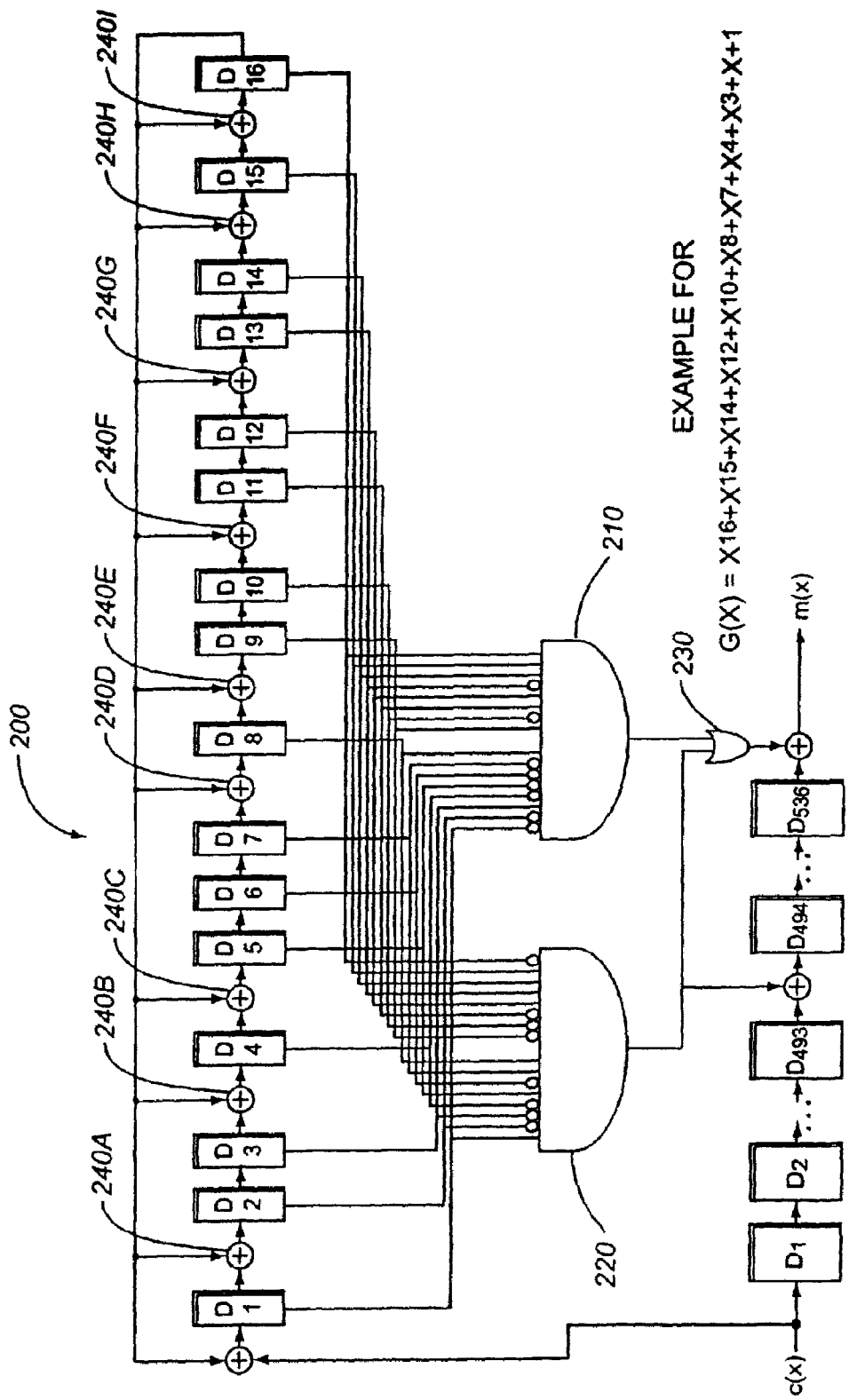
FIG. 3 is a schematic representation of a first circuit for detecting and correcting single and double bit errors according to the present invention.

FIG. 3 illustrates a circuit 200 for detecting and correcting single and double bit errors according to a first embodiment of the present invention. The first embodiment is intended for an initial proposed transparent GFP superblock CRC-16. The circuit 200 consists of a plurality of bit circuit elements D1, D2, D3, D4, D5, D6, D7, D8, D9, D10, D11, D12, D13, D14, D15, D16, two logic AND gates 210, 220, an OR gate 230, and a plurality of input bit stream circuit elements D1, D2, ..., D493, D494, ..., D536, as shown in FIG. 3. The bit circuit elements may be implemented as bit registers, or other circuit elements such as flip-flops or transistors. The CRC polynomial implemented in the circuit 200 is $G(x)=x^{16}+x^{15}+x^{14}+x^{12}+x^{10}+x^8+x^7+x^4+x^3+x+1$.

According to the circuit 200 of FIG. 3, the input stream is a GFP superblock, essentially a 536 bit block, which is input into circuit elements D1 through D536. On a bit-by-bit basis, the D1 through D16 bit circuit elements receive input from the input stream. The circuit elements are coupled to operation circuit elements 240A, 240B, ..., 240H, 240I, which provide bitwise operations dictated by the G(x). The first AND gate 210 receives inputs from bits resulting from bitwise operations between specific selected bits. If the bits at the first AND gate 210 inputs match a predetermined bit pattern then the AND gate 210 is activated. Similarly, the second AND gate 220 receives inputs from bits resulting from bitwise operations between selected bits, specific to the second AND gate 220. If the bits at the second AND gate 220 inputs match a predetermined bit pattern then the AND gate 220 is activated. The OR gate 230 receives an input from both first AND gate 210 and the second gate 220. The OR gate is activated by a predetermined output from either or both AND gates 210 and 220. Upon activation, the OR gate 230 changes a specific bit in the bit stream. In this case, the OR gate 230 would invert the first bit, stored in the D536 circuit element, to correct the single error. If a positive output is derived from the second AND gate 220, then a double error has been detected and the bit located 43 bits behind at D493 is inverted.

The circuit operation may be expressed as the following equation:

$$B(x)=Rem(D(x)/G(x))$$

where

D(x) is said at least a portion of the 536 bit block;

G(x) is a bit pattern derived from the bit stream according to the polynomial;

B(x) is a remainder of a division operation between D(x) and G(x); and

Rem is the remainder from the modulo division of D(x) by G(x);

such that the circuit detects when B(x) does not equal 0.

The operation may be designed as a nested IF/THEN loop

If Rem (D(x)/G(x))=a double bit error pattern then flip bit 1 AND flip the bit which is n bits behind bit 1

If Rem (D(x)/G(x))=a single bit error pattern then flip bit 1.

where n is derived from the scrambler polynomial, $X^n+1$.

According to an embodiment of the present invention, n may be 43 if the $X^{43}+1$ scrambler polynomial is utilized in conjunction with the circuitry of the present invention.

In FIG. 3, the CRC-16 polynomial G(x) dictate the bitwise operation over the 536 bit GFP superblock. According to limitations of the CRC-16 error detection, the best possible error detection capability of the CRC-16 polynomial is triple error detection. With triple error detection capability, single error correction is also possible. In order to preserve the triple error detecting capability, the CRC-16 generator polynomial must have no common factors with the payload scrambler polynomial. The $x^{43}+1$ payload scrambler polynomial factors into:

$$x^{43}+1=(x+1)(x^{14}+x^{11}+x^{10}+x^9+x^8+x^7+x^6+x^5+x^4+x^{3+x^1})$$
$$(x^{14}+x^{12}+x^{10}+x^7+x^4+x^2+1)$$
$$(x^{14}+x^{13}+x^{11}+x^7+x^3+x^1).$$

Figure 4:
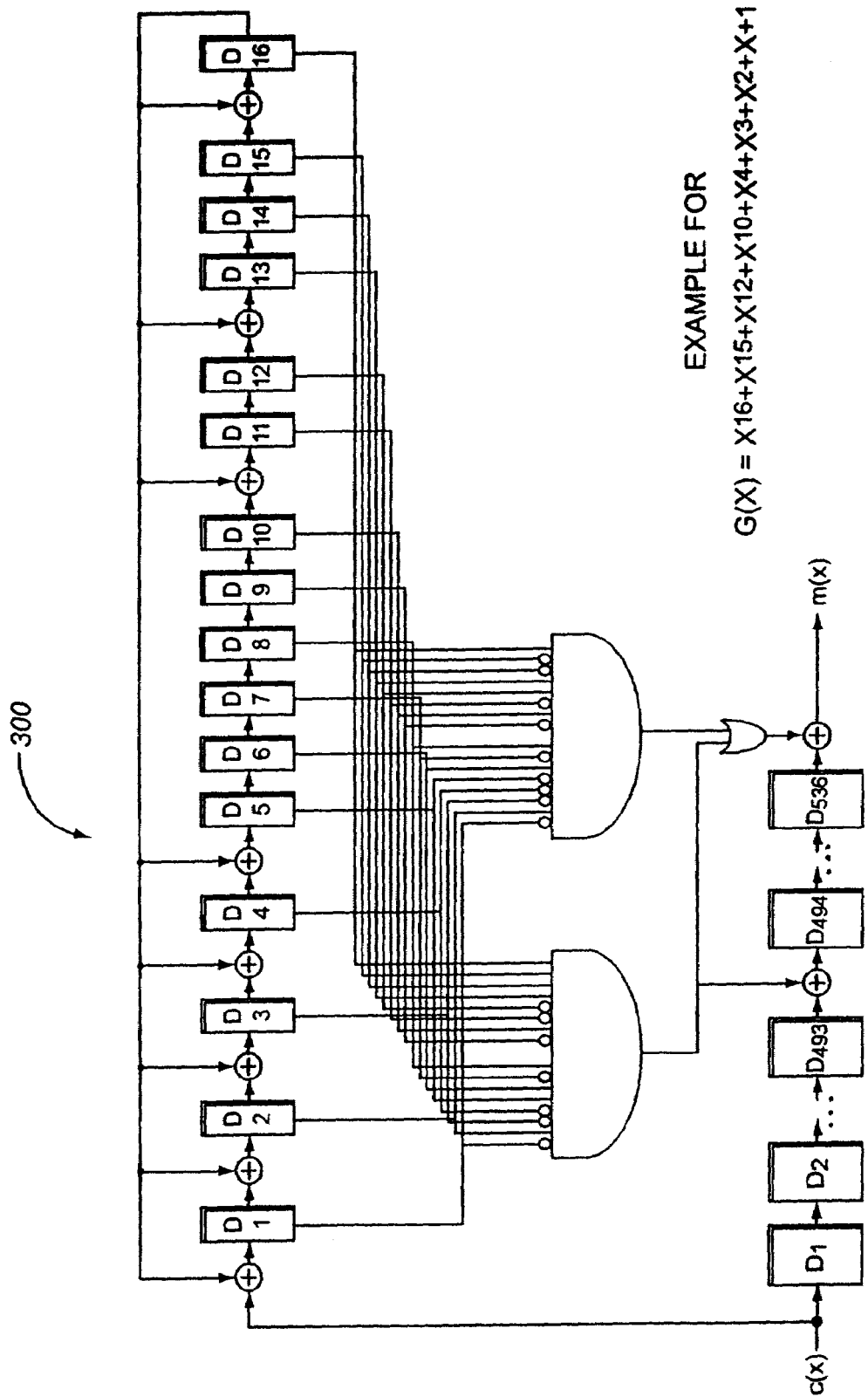
FIG. 4 is a schematic representation of a second circuit for detecting and correcting single and double bit errors according to the present invention.

All of the known standard CRC-16 generator polynomials, have x+1 as a factor, and would therefore suffer degraded performance due to duplicate errors. In order to also provide double error detecting capability the CRC generator polynomial must have a factor that is a primitive polynomial with a degree of at least 10. To further provide a triple bit error detection, a CRC-16 generator polynomial with triple error detection capability was utilized. According to the present invention, it was determined that various CRC-16 generator polynomials met both the double error detection and the no common scrambler factors criteria. The CRC polynomial G(x) of FIG. 3, and that of FIG. 4, are examples of CRC polynomials which met the above criteria.

As explained in the background, each single transmission error will result in either one or two superblock errors in the descrambled data. Due to the feedback tap on the $x^{43}+1$ descrambler, a second error is always created exactly 43 bit after the bit affected by the transmission bit error. If both of these errors fall within the data of the same superblock, then the CRC-16 must cope with two errors. It is possible, however, for the two errors to occur around a superblock boundary where one of the errors appears in each superblock. Errors occurring at boundaries is discussed in detail in a technical paper T1X1.5/2001-094, "Impact of $x^{43}+1$ Scrambler on the Error Detection Capabilities of Ethernet CRC," standards contribution from Norival Figueira, Nortel Networks, March 2001, which incorporated herein by reference. A more rigorous theoretical analysis is to be found in "Analysis of the Interaction Between CRC Error Detecting Polynomials and Self-Synchronous Payload Scramblers", Steven S. Gorshe, PhD Dissertation, Oregon State University, USA, 2002.

In general, single error correction is possible with a linear cyclic code as long as each possible error pattern leads to a unique syndrome at the decoder. For a CRC, the syndrome created by the bit error pattern is the remainder calculated in the division of the data block by the CRC generator polynomial. A remainder other than zero indicates the presence of an error. In order to preserve the capability of correcting single transmission errors, the syndromes (remainders) must be unique for each possible single error and 43-bit-spaced double error pattern. The unique syndromes allow the decoder to know the original error pattern, which is what makes the correction possible. For each of the CRC-16 polynomials that met the above triple error detecting criteria, bit error patterns were calculated for each possible single error and 43-bit-spaced double errors.

The following are the single-bit error patterns and double-bit error patterns which met the following criteria.

According to FIG. 3, single-bit error patterns and double-bit error patterns are detected by the first and second AND gates to determine whether single-bit errors and double-bit errors have occurred.

The single-bit error patterns (Syndrome A) and the double bit patterns (Syndrome B) are as follows:

| Syndrome A |
| --- |
| 0000000000000001 |
| 0000000000000010 |
| 0000000000000100 |
| 0000000000001000 |
| 0000000000010000 |
| 0000000000100000 |
| 0000000001000000 |
| 0000000010000000 |
| 0000000100000000 |
| 0000001000000000 |
| 0000010000000000 |
| 0000100000000000 |
| 0001000000000000 |
| 0010000000000000 |
| 0100000000000000 |
| 1000000000000000 |
| 1001010000011111 |
| 1011110000100001 |
| 1110110001011101 |
| 0100110010100101 |
| 1001100101001010 |
| 1010011010001011 |
| 1101100100001001 |
| 0010011000001101 |
| 0100110000011010 |
| 1001100000110100 |
| 1010010001110111 |
| 1101110011110001 |
| 0010110111111101 |
| 0101101111111010 |
| 1011011111110100 |
| 1111101111110111 |
| 0110001111110001 |
| 1100011111100010 |
| 0001101111011011 |
| 0011011110110110 |
| 0110111101101100 |
| 1101111011011000 |
| 0010100110101111 |
| 0101001101011110 |
| 1010011010111100 |
| 1101100101100111 |
| 0010011011010001 |
| 0100110110100010 |
| 1001101101000100 |
| 1010001010010111 |
| 1101000100110001 |
| 0011011001111101 |
| 0110110011111010 |
| 1101100111110100 |
| 0010011111110111 |
| 0100111111101110 |
| 1001111111011100 |
| 1010101110100111 |
| 1100001101010001 |
| 0001001010111101 |
| 0010010101111010 |
| 0100101011110100 |
| 1001010111101000 |
| 1011111111001111 |
| 1110101110000001 |
| 0100001100011101 |
| 1000011000111010 |
| 1001100001101011 |
| 1010010011001001 |
| 1101110110001101 |
| 0010111100000101 |
| 0101111000001010 |
| 1011110000010100 |
| 1110110000110111 |
| 0100110001110001 |
| 1001100011100010 |
| 1010010111011011 |
| 1101111110101001 |
| 0010101101001101 |
| 0101011010011010 |
| 1010110100110100 |
| 1100111001110111 |
| 0000100011110001 |
| 0001000111100010 |
| 0010001111000100 |
| 0100011110001000 |
| 1000111100010000 |
| 1000101000111111 |
| 1000000001100001 |
| 1001010011011101 |
| 1011110110100101 |
| 1110111101010101 |
| 0100101010110101 |
| 1001010101101010 |
| 1011111011001011 |
| 1110100110001001 |
| 0100011100001101 |
| 1000111000011010 |
| 1000100000101011 |
| 1000010001001001 |
| 1001110010001101 |
| 1010110100000101 |
| 1100111000010101 |
| 0000100000110101 |
| 0001000001101010 |
| 0010000110010100 |
| 0100001101010000 |
| 1000001101010000 |
| 1001001010111111 |
| 1011000101100001 |
| 1111101011011101 |
| 0111100110100101 |
| 1111001101001010 |
| 0111001010001011 |
| 1110010100010110 |
| 0101111000110011 |
| 1011110001100110 |
| 1110110011010011 |
| 0100110110111001 |
| 1001101101110010 |
| 1010001011111011 |
| 1101000111101001 |
| 0011011111001101 |
| 0110111110011010 |
| 1101111100110100 |
| 0010101001110111 |
| 0101010011101110 |
| 1010100111011100 |
| 1100011110100111 |
| 0001101101010001 |
| 0011011010100010 |
| 0110110101000100 |
| 1101101010001000 |
| 0010000100001111 |
| 0100001000011110 |
| 1000010000111100 |
| 1001110001100111 |
| 1010110011010001 |
| 1100110110111101 |
| 0000111101100101 |
| 0001111011001010 |
| 0011110110010100 |
| 0111101100101000 |
| 1111011001010000 |
| 0111100010111111 |
| 1111000101111110 |
| 0111011011100011 |
| 1110110111000110 |
| 0100111110010011 |
| 1001111100100110 |
| 1010101001010011 |
| 1100000010111001 |
| 0001010101101101 |
| 0010101011011010 |
| 0101010110110100 |

-continued

| Syndrome A |
|---|
| 1010101101101000 |
| 1100001011001111 |
| 0001000110000001 |
| 0010001100000010 |
| 0100011000000100 |
| 1000110000001000 |
| 1000110000001111 |
| 1000110000000001 |
| 1000110000011101 |
| 1000110000100101 |
| 1000110001010101 |
| 1000110010110101 |
| 1000110101110101 |
| 1000111011110101 |
| 1000100111110101 |
| 1000011111110101 |
| 1001101111110101 |
| 1010001111110101 |
| 1101001111110101 |
| 0011001111110101 |
| 0110011111101010 |
| 1100111111010100 |
| 0000101110110111 |
| 0001011101101110 |
| 0010111011011100 |
| 0101110110111000 |
| 1011101101110000 |
| 1110001011111111 |
| 0101000111100001 |
| 1010001111000010 |
| 1101001110011011 |
| 0011001100101001 |
| 0110011001010010 |
| 1100110010100100 |
| 0000110101010111 |
| 0001101010101110 |
| 0011010101011100 |
| 0110101010111000 |
| 1101010101110000 |
| 0011111011111111 |
| 0111110111111110 |
| 1111101111111100 |
| 0110001111100111 |
| 1100011111001110 |
| 0001101110000011 |
| 0011011100000110 |
| 0110111000001100 |
| 1101110000011000 |
| 0010110000101111 |
| 0101100001011110 |
| 1011000010111100 |
| 1110101011100111 |
| 0111111011010001 |
| 1111110110100010 |
| 0110111101011011 |
| 1101111010110110 |
| 0010100101110011 |
| 0101001011100110 |
| 1010010111001100 |
| 1101111110000111 |
| 0010101100010001 |
| 0101011000100010 |
| 1010110001000100 |
| 1100110010010111 |
| 0000110100110001 |
| 0001101001100010 |
| 0011010011000100 |
| 0110100110001000 |
| 1101001100010000 |
| 0011001000111111 |
| 0110010001111110 |
| 1100100011111100 |
| 0000100111100111 |
| 0000101111001110 |
| 0001011110011100 |
| 0010111100111000 |
| 0101111001110000 |

-continued

| Syndrome A |
|---|
| 1011110011100000 |
| 1110110111011111 |
| 0100111110100001 |
| 1001111101000010 |
| 1010101010011011 |
| 1100000100101001 |
| 0001011001001101 |
| 0010110010011010 |
| 0101100100110100 |
| 1011001001101000 |
| 1111000011001111 |
| 0111010110000001 |
| 1110101100000010 |
| 0100001000011011 |
| 1000010000110110 |
| 1001110001110011 |
| 1010110011111001 |
| 1100110111101101 |
| 0000111111000101 |
| 0001111110001010 |
| 0011111100010100 |
| 0111111000101000 |
| 1111110001010000 |
| 0110110010111111 |
| 1101100101111110 |
| 0010011011100011 |
| 0100110111000110 |
| 1001101110001100 |
| 1010001100000111 |
| 1101001000010001 |
| 0011000000111101 |
| 0110000001111010 |
| 1100000011110100 |
| 0001010111110111 |
| 0010101111101110 |
| 0101011111011100 |
| 1010111110111000 |
| 1100101101101111 |
| 0000001011000001 |
| 0000010110000010 |
| 0000101100000100 |
| 0001011000001000 |
| 0010110000010000 |
| 0101100000100000 |
| 1011000001000000 |
| 1111010010011111 |
| 0111110100100001 |
| 1111101001000010 |
| 0110000100011011 |
| 1100000100110110 |
| 0001011001110011 |
| 0010110011100110 |
| 0101100111001100 |
| 1011001110011000 |
| 1111001100101111 |
| 0111001001000001 |
| 1110010010000010 |
| 0101110100011011 |
| 1011101000110110 |
| 1110000001110011 |
| 0101010011111001 |
| 1010100111110010 |
| 1100011111111011 |
| 0001101111101001 |
| 0011011111010010 |
| 0110111110100100 |
| 1101111101001000 |
| 0010101010001111 |
| 0101010100011110 |
| 1010101000111100 |
| 1100000011100111 |
| 0001010011010011 |
| 0010100110100010 |
| 0101001101000100 |
| 1010011010001000 |
| 1101100100001111 |
| 0010011000000001 |

| Syndrome A |
|---|
| 0100110000000010 |
| 1001100000000100 |
| 1010010000010111 |
| 1101110000110001 |
| 0010110001111101 |
| 0101100011111010 |
| 1011000111110100 |
| 1111011111110111 |
| 0111101111110001 |
| 1111011111100010 |
| 0111101111011011 |
| 1111011110110110 |
| 0111101101110011 |
| 1111101101100110 |
| 0111100111010011 |
| 1111001110100110 |
| 0111001101010011 |
| 1110011010100110 |
| 0101100101010011 |
| 1011001010100110 |
| 1111000101010011 |
| 0111011010111001 |
| 1110110101110010 |
| 0100111011111011 |
| 1001110111110110 |
| 1010111111110011 |
| 1100101111111001 |
| 0000001111101101 |
| 0000011111011010 |
| 0000111110110100 |
| 0001111101101000 |
| 0011111011010000 |
| 0111110110100000 |
| 1111101101000000 |
| 0110001010011111 |
| 1100010100111110 |
| 0001111001100011 |
| 0011110011000110 |
| 0111100110001100 |
| 1111001100011000 |
| 0111001000101111 |
| 1110010001011110 |
| 0101110010100011 |
| 1011100101000110 |
| 1110011010010011 |
| 0101100100111001 |
| 1011001001110010 |
| 1110000111110111 |
| 0111010111101001 |
| 1110101111010010 |
| 0100001110111011 |
| 1000011101110110 |
| 1001101011110011 |
| 1010000111111001 |
| 1101011111101101 |
| 0011101111000101 |
| 0111011110001010 |
| 1110111100010100 |
| 0100101000110111 |
| 1001010001101110 |
| 1011110011000011 |
| 1110110110011001 |
| 0100111100101101 |
| 1001111001011010 |
| 1010100010101011 |
| 1100010101001001 |
| 0001111010001101 |
| 0011110100011010 |
| 0111101000110100 |
| 1111010001101000 |
| 0111110011001111 |
| 1111100110011110 |
| 0110011100100011 |
| 1100111001000110 |
| 0000100010010011 |
| 0001000100100110 |
| 0010001001001100 |

| Syndrome A |
|---|
| 0100010010011000 |
| 1000100100110000 |
| 1000011001111111 |
| 1001100011100001 |
| 1010010111011101 |
| 1101111110100101 |
| 0010101101010101 |
| 0101011010101010 |
| 1010110101010100 |
| 1100111010110111 |
| 0000100101110001 |
| 0001001011100010 |
| 0010010111000100 |
| 0100101110001001 |
| 1001011100010000 |
| 1011101000111111 |
| 1110000001100001 |
| 0101010011011101 |
| 1010100110111010 |
| 1100011101101011 |
| 0001101011001001 |
| 0011010110010010 |
| 0110101100100100 |
| 1101011001001000 |
| 0011100010001111 |
| 0111000100011110 |
| 1110001000111100 |
| 0101000001100111 |
| 1010000011001110 |
| 1101010110000011 |
| 0011111100011001 |
| 0111111000110010 |
| 1111110001100100 |
| 0110110011010111 |
| 1101100110101110 |
| 0010011101000011 |
| 0100111010000110 |
| 1001110100001100 |
| 1010111000000111 |
| 1100100000010001 |
| 0000010000111101 |
| 0000100001111010 |
| 0001000011110100 |
| 0010000111101000 |
| 0100001111010000 |
| 1000011110100000 |
| 1001101101011111 |
| 1010001010100001 |
| 1101000101011101 |
| 0011011010100101 |
| 0110110101001010 |
| 1101101010010100 |
| 0010000100110111 |
| 0100001001101110 |
| 1000010011011100 |
| 1001110110100111 |
| 1010111101010001 |
| 1100101010111101 |
| 0000000101100101 |
| 0000001011001010 |
| 0000010110010100 |
| 0000101100101000 |
| 0001011001010000 |
| 0010110010100000 |
| 0101100101000000 |
| 1011001010000000 |
| 1111000100011111 |
| 0111011000100001 |
| 1110110001000010 |
| 0100110010011011 |
| 1001100100110110 |
| 1010011001110011 |
| 1101100011111001 |
| 0010010111101101 |
| 0100101110110100 |
| 1001011101101000 |
| 1011101101110111 |

Syndrome A 1110001011110001
0101000111111101
1010001111111010
1101001111101011
0011001111001001
0110011110010010
1100111100100100
0000101001010111
0001010010101110
0010100101011100
0101001010111000
1010010101110000
1101111011111111
0010100111100001
0101001111000010
1010011110000100
1101101100010111
0010001000110001
0100010001100010
1000100011000100
1000010110010111
1001111100110001
1010101001111101
1100000011100101
0001010111010101
0010101110101010
0101011101010100
1010111010101000
1100100101001111
0000011010000001
0000110100000010
0001101000000100
0011010000001000
0110100000010000
1101000000100000
0011010001011111
0110100010111110
1101000101111100
0011011011100111
0110110111001110
1101101110011100
0010001100100111
0100011001001110
1000110010011100
1000110100100111
1000111001010001
1000100010111101
1000010101100101
1001111011010101
1010100110110101
1100011101110101
0001101011110101
0011010111101010
0110101111010100
1101011110101000
0011101101001111
0111011010011110
1110110100111100
0100111001100111
1001110011001110
1010110110000011
1100111100011001
0000101000101101
0001010001011010
0010100010110100
0101000101101000
1010001011010000
1101000110111111
0011011101100001
0110111011000010
1101110110000100
0010111100010111
0101111000101110
1011110001011100
1110110010100111

Syndrome A 0100110101010001
1001101010100010

Syndrome B 0100110110100011
1001101101000110
1010001010010011
1101000100111001
0011011001101101
0110110011011010
1101100110110100
0010011101110111
0100111011101110
1001110111011100
1010111110100111
1100101101010001
0000001010111101
0000010101111010
0000101011110100
0001010111101000
0010101110100000
1010111101000000
1100101010011111
0000000100100001
0000001001000010
0000010010000100
0000100100001000
0001001000010000
0010010000100000
0100100001000000
1001000010000000
1011010100011111
1111111000100001
0110100001011101
1101000010111010
0011010101101011
0110101011010110
1101010110101100
0011111101000111
0111111010001110
1111110100011100
0110111000100111
1101110001001110
0010110010000011
0101100100000110
1011001000001100
1111000000000111
0111010000010001
1110100000100010
0100010001011011
1000100010110110
1000010101110011
1001111011111001
1010100111101101
1100011111000101
0001101110010101
0011011100101010
0110111001010100
1101110010101000
0010110101001111
0101101010011110
1011010100111100
1111111001100111
0110100011010001
1101000110100010
0011011101011011
0110111010110110
1101110101101100
0010110011000111
0101110110001110
1011101100011100
1110001000100111

Syndrome B 0101000001010001
1010000010100010
1101010101011011
0011110101011001
0111110101010010
1111101010100100
0110000101010111
1100001101101110
0001000101000011
0010001101000110
0100010100001100
1000101000011000
1000000000101111
1001010001000001
1011110010011101
1110110100100101
0100111001010101
1001110010101010
1010110101001011
1100111010001001
0000100100001101
0001001000011010
0010010000110100
0100100001101000
1001000011010000
1011010110111111
1111111101100001
0110101011011101
1101010110111010
0011111101101011
0111111011010110
1111110110101100
0110111101000111
1101111010001110
0010100100000011
0101001000000110
1010010000001100
1101110000000111
0010110000010001
0101100000100010
1011000001000100
1111010010010111
0111110100110001
1111101001100010
0110000011011011
1100000110110110
0001011101110011
0010111011100110
0101110111001100
1011101110011000
1110001100101111
0101001001000001
1010010010000010
1101110100011011
0010111000101001
0101110001010010
1011100010100100
1110010101010111
0101111010110001
1011110101100010
1110111011011011
0100100110101001
1001001101010010
1011001010111011
1111000101101001
0111011011001101
1110110110011010
0100111001010011
1001111001010110
1010100101110011
1100010101111001
0001111011101101
0011110111011010
0111101110110100
1111011101101000
0111101011001111
1111010110011110

Syndrome B 0111111100100011
1111111001000110
0110100010010011
1101000100100110
0011011001010011
0110110010010110
1101100101001100
0010011010000111
0100110100001110
1001101000011100
1010000000100111
1101010001010001
0011110010111101
0111100101111010
1111001011110100
0111000111110111
1110001111101110
0101001111000011
1010011110000110
1101101100010011
0010001000111001
0100010001110010
1000100011100100
1000010111010111
1001111110110001
1010101101111101
1100001011100101
0001000111010101
0010001110101010
0100011101010100
1000111010101000
1000100101001111
1000011010000001
1001100100011101
1010011000100101
1101100001010101
0010010010110101
0100100101101010
1001001011010100
1011000110110111
1111011101110001
0111101011111101
1111101011111100
0111111111101011
1111111110010110
0110101110110011
1101011110100110
0011101011010011
0111010110100110
1110101101001100
0100001010000111
1000010100001110
1001111000000011
1010100000011001
1100010000101101
0001110001000101
0011100010001010
0111000100010100
1110001000101000
0101000001001111
1010000010011110
1101010100100011
0011111001011001
0111110101011010
1111100101100100
0110011011010111
1100110110101110
0000111101000011
0001111010000110
0011110100001100
0111101000011000
1111010000110000
0111110001111111
1111100011111110
0110010111100011
1100101111000110
0000001110010011

| Syndrome B | Syndrome B |
|---|---|
| 0000011100100110 | 0101000000101110 |
| 0000111001001100 | 1010000001011100 |
| 0001110010011000 | 1101010010100111 |
| 0011100100110000 | 0011110101010001 |
| 0111001001100000 | 0111101010100010 |
| 1110010011000000 | 1111010010100100 |
| 0101110110011111 | 0111111010010111 |
| 1011101100111110 | 1111110100101110 |
| 1110001001100011 | 0110111001000011 |
| 0101000011011001 | 1101110010000110 |
| 1010000110110010 | 0010110100010011 |
| 1101011101111011 | 0101101000100110 |
| 0011101011101001 | 1011010001001100 |
| 0111010111010010 | 1111110010000111 |
| 1110101110100100 | 0110110100010001 |
| 0100001101010111 | 1101101000100010 |
| 1000011010101110 | 0010000010011011 |
| 1001100101000011 | 0100000010110110 |
| 1010011010011001 | 1000000101101100 |
| 1101100100101101 | 1001011011000111 |
| 0010011001000101 | 1011100110010001 |
| 0100110010001010 | 1110011100111011 |
| 1001100100010100 | 0101101001100101 |
| 1010011000110111 | 1011010010001010 |
| 1101100001110001 | 1111110110001011 |
| 0010010011111101 | 0110111100001001 |
| 0100100111111010 | 1101111000010010 |
| 1001001111110100 | 0010100000111011 |
| 1011001111110111 | 0101000001110110 |
| 1111001111110001 | 1010000011101100 |
| 0111001111111101 | 1101010111000111 |
| 1110011111111010 | 0011111110010001 |
| 0101101111101011 | 0111111100100010 |
| 1011011111010110 | 1111111001000100 |
| 1111101110110011 | 0110100010010111 |
| 0110001101111001 | 1101000100101110 |
| 1100011011110010 | 0011010010000011 |
| 0001100111111011 | 0110110010000110 |
| 0011001111110110 | 1101100100001100 |
| 0110011111101100 | 0010011000000111 |
| 1100111111011000 | 0100110000001110 |
| 0000101110101111 | 1001100000011100 |
| 0001011101011110 | 1010010000100111 |
| 0010111010111100 | 1101110001010001 |
| 0101110101111000 | 0010110010111101 |
| 1011101011110000 | 0101100101111010 |
| 1110000111111111 | 1011001011110100 |
| 0101011111100001 | 1111000111110111 |
| 1010111111000010 | 0111011111110001 |
| 1100101110011011 | 1110111111100010 |
| 0000001100101001 | 0100101111011011 |
| 0000011001010010 | 1001011110110110 |
| 0000110010100100 | 1011101101110011 |
| 0001100101001000 | 1110001011111001 |
| 0011001010010000 | 0101000111101101 |
| 0110010100100000 | 1010001111011010 |
| 1100101001000000 | 1101001110101011 |
| 0000000010011111 | 0011001101001001 |
| 0000000100111110 | 0110011010010010 |
| 0000001001111100 | 1100110100100100 |
| 0000010011111000 | 0000111001010111 |
| 0000100111110000 | 0001110010101110 |
| 0001001111100000 | 0011100101011100 |
| 0010011111000000 | 0111001010111000 |
| 0100111110000000 | 1110010101110000 |
| 1001111100000000 | 0101110111111111 |
| 1010101000011111 | 1011110111111110 |
| 1100000000100001 | 1110111111100011 |
| 0001010001011101 | 0100101111011001 |
| 0010100010111010 | 1001011110110010 |
| 0101000101110100 | 1011101101111011 |
| 1010001011101000 | 1110001011101001 |
| 1101000111001111 | 0101000111001101 |
| 0011011110000001 | 1010001110011010 |
| 0110111100000010 | 1101001100101011 |
| 1101111000000100 | 0011001001001001 |
| 0010100000010111 | 0110010010010010 |

| Syndrome B |
|---|
| 1100100100100100 |
| 0000011001010111 |
| 0000110010101110 |
| 0001100010011100 |
| 0011001010111000 |
| 0110010101110000 |
| 1100101011100000 |
| 0000000111011111 |
| 0000001110111110 |
| 0000011101111100 |
| 0000111011111000 |
| 0001110111110000 |
| 0011101111100000 |
| 0111011111000000 |
| 1110111110000000 |
| 0100101100011111 |
| 1001011000111110 |
| 1011100001100011 |
| 1110010011011001 |
| 0101110110101101 |
| 1011101101011010 |
| 1110001010101011 |
| 0101000101001001 |
| 1010001010010010 |
| 1101000100111011 |
| 0011011001101001 |
| 0110110011010010 |
| 1101100110100100 |
| 0010011101010111 |
| 0100111010101110 |
| 1001110101011100 |
| 1010111010100111 |
| 1100100101010001 |
| 0000011010111101 |
| 0000110101111010 |
| 0001101011110100 |
| 0011010111101000 |
| 0110101111010000 |
| 1101011110100000 |
| 0011101101011111 |
| 0111011010111110 |
| 1110110101111100 |
| 0100111011100111 |
| 1001110111001110 |
| 1010111110000011 |
| 1100101100011001 |
| 0000001000101101 |
| 0000010001011010 |
| 0000100010110100 |
| 0001000101101000 |
| 0010001011010000 |
| 0100010110100000 |
| 1000101101000000 |
| 1000001010011111 |
| 1001000100100001 |
| 1011010010011101 |
| 1111100010100101 |
| 0110010101010101 |
| 1100101010101010 |
| 0000000101010101 |
| 0000001010010110 |
| 0000001100101100 |
| 0000101001011000 |
| 0001010010110000 |
| 0010100101100000 |
| 0101001011000000 |
| 1010010110000000 |
| 1101111100011111 |
| 0010101000100001 |
| 0101010001000010 |
| 1010100010000100 |
| 1100010100010111 |
| 0001111000110001 |
| 0011110001100010 |
| 0111100011000100 |
| 1111000110001000 |
| 0111011100001111 |

| Syndrome B |
|---|
| 1110111000011110 |
| 0100100000100011 |
| 1001000001000110 |
| 1011010010010011 |
| 1111110100111001 |
| 0110111001101101 |
| 1101110011011010 |
| 0010110110101011 |
| 0101101101010110 |
| 1011011010101100 |
| 1111100101000111 |
| 0110011010010001 |
| 1100110100100010 |
| 0000111001011011 |
| 0001110010110110 |
| 0011100101101100 |
| 0111001011011000 |
| 1110010110110000 |
| 0101111101111111 |
| 1011111011111110 |
| 1110100111100011 |
| 0100011111011001 |
| 1000111110110010 |
| 1000101101111011 |
| 1000001011101001 |
| 1001000111001101 |
| 1011011110000101 |
| 1111101100010101 |
| 0110001000110101 |
| 1100010001101010 |
| 0001110011001011 |
| 0011100110010110 |
| 0111001100101100 |
| 1110011001011000 |
| 0101100010101111 |
| 1011000101011110 |
| 1111011010100011 |
| 0111100101011001 |
| 1111001010110010. |

The above explanation of the present invention, as embodied in circuit 200 of FIG. 3, has assumed that positive logic is utilized. Positive bit logic was applied in detecting and correcting errors based on the outputs derived from both bitwise operations and bit logic operations. For example, a binary output of 1 at an AND gate indicates an error. However, if negative logic is utilized in the circuit 200, a binary output of 0 at the AND gate 210 would indicate an error as well.

FIG. 4 illustrates a circuit 300 for detecting and correcting single and double bit errors according to a second embodiment of the present invention. The second embodiment is intended for a final version transparent GFP superblock CRC-16. The circuit 300 differs from that of FIG. 3, in that bitwise operations are dictated by a different G(x) polynomial. The CRC polynomial implemented in this circuit 300 is $G(x) = x^{16}+x^{15}+x^{14}+x^{12}+x^{10}+x^4+x^3+x^2+x+1$.

It should be mentioned that while the circuits of FIGS. 3 and 4 detect double bit errors generated by a descrambler, the circuits of the present invention detect single bit, double bit, and triple bit errors derived from any number of other sources. The 536 bit block need not be derived from a descrambler, such as is used on a GFP CRC-16. The circuit of the present invention may derive a 536-bit superblock, prior to processing by the circuit of the present invention. Furthermore, the art that the present invention may be embodied in other circuitry. For example, additional AND gates may be utilized to perform error detection in both circuits 200 and 300 of FIGS. 3 and 4.

Figure 5:
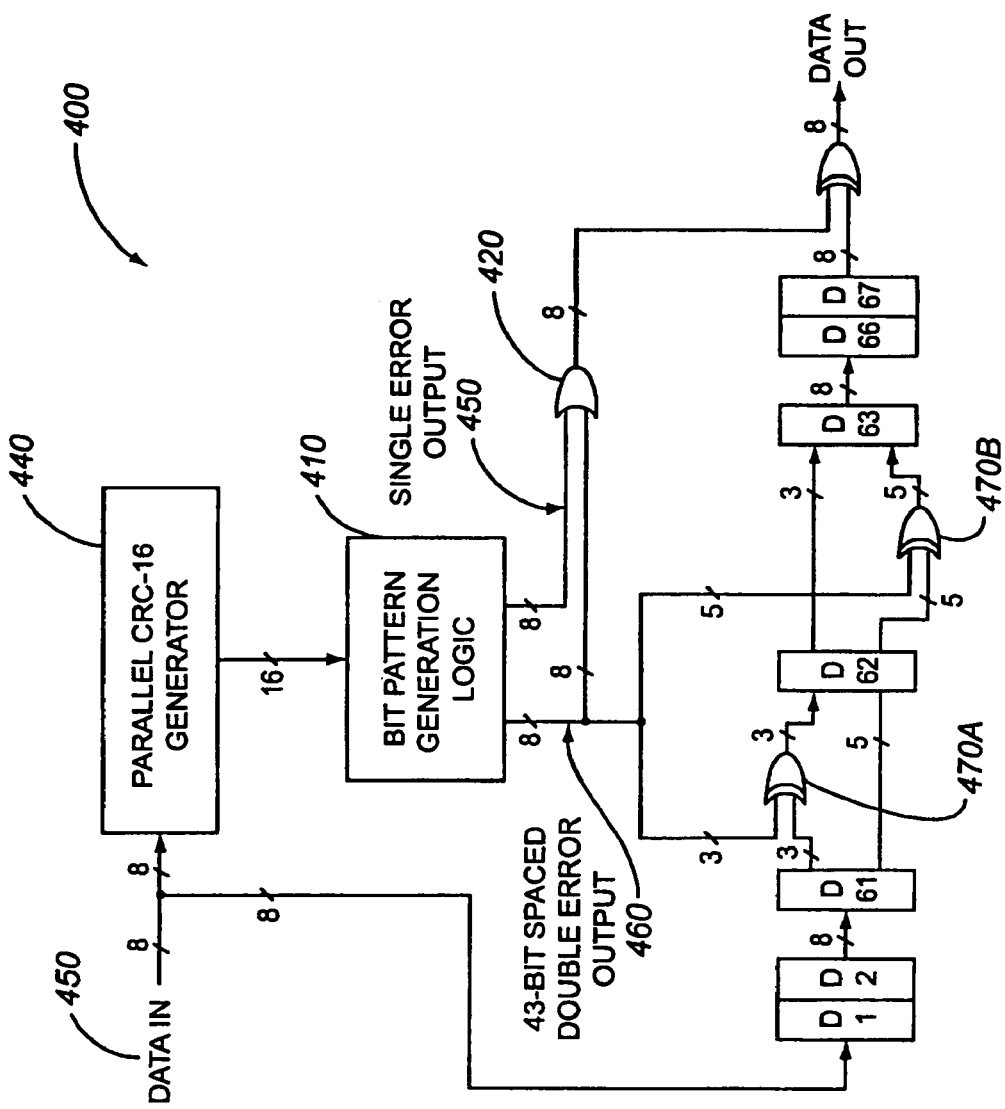
FIG. 5 is a block diagram of a circuit for an 8-bit wide parallel implementation according to the present invention.

FIG. 5 is a block diagram of a circuit 400 for an 8-bit wide parallel implementation according to a third embodiment of the present invention. As compared to the serial bit implementation of FIGS. 3 and 4, the error detection logic 410 outputs an 8-bit wide output to the OR gate 420. In an 8-bit wide parallel implementation, errors are detected for an 8-bit wide block. The single and double errors are corrected in the same manner as in the implementation of FIG. 4 with the advantage that operating on 8-bit data blocks allows the circuit to operate at ⅛ the data path clock speed of a serial implementation such as in FIGS. 3 and 4. The data path clock speed reduction is a significant advantage for high-speed data transmission.

In FIG. 5, the process implemented by the circuit 400 is similar to that of FIGS. 3 and 4. The parallel CRC-16 generator consists of a bit circuit elements which are coupled to sequentially receive and store a sequential 16 bits derived from an 8-bit wide input stream 450. The generator 440 performs bitwise operations on the 16 stored in the bit circuit elements. The bitwise operation, again, is dictated by the CRC polynomial selected. Upon completion of the bitwise operations, the generator 440 outputs the generated 16 bits to the bit pattern generation logic 410. If the single error output 450 indicates a single bit error, then the OR gate 420 enables the errorred bit within the last 8 bits in the bit circuit element D67 to be corrected. If the double error output 450 indicates a 43-bit spaced double error, then the exclusive-OR logic gates 470A, 47B enable the bit error which is 43 bits behind the first bit to be corrected. The bits of the errored byte to be corrected are stored in two bit circuit element, D61 and D62. The first 3 bits, of the errorred byte, are stored in the D61 bit stream circuit element. The last 5 bits are stored in the bit stream circuit element D62.

Based on the circuit implementation shown in FIGS. 3, 4, and 5, the present invention is not limited to a single CRC polynomial. Rather, the present invention provides single error and double error detection and correction capabilities for both serial and parallel bit streams, in which a number of CRC polynomials may be utilized. The above bit error patterns are not exclusive to the GFP protocol. Any protocol which utilizes a fixed-length block may utilize the specific bit patterns to detect errors in portions of the block bit stream.

What is claimed is:

1. A circuit for detecting and correcting errors in a bit stream, said circuit including at least two logical gates that determine if at least one of a plurality of conditions is present, each one of said plurality of conditions indicating at least one error in said bit stream and activation of at least one of said at least two logical gates changes a state of a specific bit in said bit stream to correct at least one error;

wherein each one of said plurality of conditions is a specific bit pattern denoting a unique error pattern in said bit stream, each bit in said specific bit pattern resulting from bitwise operations between specific selected bits in said bit stream;

wherein said plurality of conditions are divided into two groups, a first group which indicates a first type of error in said bit stream and a second group which indicates a second type of error in said bit stream; and wherein said at least two logical gates include a first logic gate associated with said first group and a second logic gate associated with said second group, such that said first logic gate is activated if a bit error pattern from said first group is detected and said second logic gate is activated if a bit pattern from said second group is detected.

2. The circuit as claimed in claim 1, wherein said first logic gate receives first logic gate inputs from bits resulting from bitwise operations dictated by a CRC polynomial between specific selected bits in said bit pattern, such that said first logic gate has a predetermined output when said first logic gate inputs correspond to a bit pattern chosen from a group consisting of: Syndrome A.

3. The circuit as claimed in claim 2, wherein said predetermined output is a binary number.

4. The circuit as claimed in claim 1, wherein said second logic gate receives second logic inputs from bits resulting from bitwise operations dictated by a CRC polynomial between specific selected bits in said bit pattern, such that said second logic gate has a predetermined output when said second logic inputs correspond to a bit pattern chosen from a group consisting of: Syndrome B.

5. The circuit as claimed in claim 4, wherein said predetermined output is a binary number.

6. The circuit as claimed in claim 4 wherein said first logic gate and said second logic gate are both logical AND gates.

7. The circuit as claimed in claim 4, wherein said first logic gate and said second logic gate are both logical OR gates.

8. The circuit as claimed in claim 4, wherein said first logic gate and said second logic gate are both logical NAND gates.

9. The circuit as claimed in claim 4, wherein said first logic gate and said second logic gate are both logical NOR gates.

10. The circuit as claimed in claim 4, wherein said at least two logical gates includes an OR gate receiving an input from said first logic gate and said second logic gate such that a state of a specific bit in said bit pattern is changed if either said first logic gate or said second logic gate is activated.

11. The circuit as claimed in claim 10, wherein said first logic gate and said second logic gate are both logical AND gates.

12. The circuit as claimed in claims 4, wherein said at least two logical gates includes an AND gate receiving an input from said first logic gate and said second logic gate such that a state of a specific bit in said bit pattern is changed if either said first logic gate or said second logic gate is activated.

13. The circuit as claimed in claim 12, wherein said first logic gate and said second logic gate are both logical OR gates.

14. The circuit as claimed in claim 4, wherein said at least two logical gates includes a NAND gate receiving an input from said first logic gate and said second logic gate such that a state of a specific bit in said bit pattern is changed if either said first logic gate or said second logic gate is activated.

15. The circuit as claimed in claim 14, wherein said first logic gate and said second logic gate are both logical NAND gates.

16. The circuit as claimed in claim 4, wherein said at least two logical gates includes a NOR gate receiving an input from said first logic gate and said second logic gate such that a state of a specific bit in said bit pattern is changed if either said first logic gate or said second logic gate is activated.

17. The circuit as claimed in claim 16, wherein said first logic gate and said second logic gate are both logical NOR gates.

18. The circuit as claimed in claim 1 wherein said first logic gate and said second logic gate are both logical AND gates.

19. The circuit as claimed in claim 1, wherein said first logic gate and said second logic gate are both logical OR gates.

20. The circuit as claimed in claim 1, wherein said first logic gate and said second logic gate are both logical NAND gates.

21. The circuit as claimed in claim 1, wherein said first logic gate and said second logic gate are both logical NOR gates.

22. The circuit as claimed in claim 1, wherein said at least two logical gates includes an OR gate receiving an input from said first logic gate and said second logic gate such that a state of a specific bit in said bit pattern is changed if either said first logic gate or said second logic gate is activated.

23. The circuit as claimed in claim 22, wherein said first logic gate and said second logic gate are both logical AND gates.

24. The circuit as claimed in claims 1, wherein said at least two logical gates includes an AND gate receiving an input from said first logic gate and said second logic gate such that a state of a specific bit in said bit pattern is changed if either said first logic gate or said second logic gate is activated.

25. The circuit as claimed in claim 24, wherein said first logic gate and said second logic gate are both logical OR gates.

26. The circuit as claimed in claim 1, wherein said at least two logical gates includes a NAND gate receiving an input from said first logic gate and said second logic gate such that a state of a specific bit in said bit pattern is changed if either said first logic gate or said second logic gate is activated.

27. The circuit as claimed in claim 26, wherein said first logic gate and said second logic gate are both logical NAND gates.

28. The circuit as claimed in claim 1, wherein said at least two logical gates includes a NOR gate receiving an input from said first logic gate and said second logic gate such that a state of a specific bit in said bit pattern is changed if either said first logic gate or said second logic gate is activated.

29. The circuit as claimed in claim 28, wherein said first logic gate and said second logic gate are both logical NOR gates.

30. A circuit for detecting and correcting errors in a bit stream, said circuit including: at least two logical gates that determine if at least one of a plurality of conditions is present, each one of said plurality of conditions indicating at least one error in said bit stream and activation of at least one of said at least two logical gates changes a state of a specific bit in said bit stream to correct at least one error; said circuit being adapted to detect a condition caused by a single error that has passed through a self-synchronous descrambler to produce a multiplied error in said bit stream; wherein said at least two logical gates include a first logic gate associated with said first group and a second logic gate associated with said second group, such that said first logic gate is activated if a bit error pattern from said first group is detected and said second logic gate is activated if a bit pattern from said second group is detected.

31. The circuit as claimed in claim 30, wherein said first logic gate receives first logic gate inputs from bits resulting from bitwise operations dictated by a CRC polynomial between specific selected bits in said bit pattern, such that said first logic gate has a predetermined output when said first logic gate inputs correspond to a bit pattern chosen from a group consisting of: Syndrome A.

32. The circuit as claimed in claim 31, wherein said predetermined output is a binary number.

33. The circuit as claimed in claim 30, wherein said second logic gate receives second logic inputs from bits resulting from bitwise operations dictated by a CRC polynomial between specific selected bits in said bit pattern, such that said second logic gate has a predetermined output when said second logic inputs correspond to a bit pattern chosen from a group consisting of: Syndrome B.

34. The circuit as claimed in claim 33, wherein said predetermined output is a binary number.

35. The circuit as claimed in claim 33 wherein said first logic gate and said second logic gate are both logical AND gates.

36. The circuit as claimed in claim 33, wherein said first logic gate and said second logic gate are both logical OR gates.

37. The circuit as claimed in claim 33, wherein said first logic gate and said second logic gate are both logical NAND gates.

38. The circuit as claimed in claim 33, wherein said first logic gate and said second logic gate are both logical NOR gates.

39. The circuit as claimed in claim 33, wherein said at least two logical gates includes an OR gate receiving an input from said first logic gate and said second logic gate such that a state of a specific bit in said bit pattern is changed if either said first logic gate or said second logic gate is activated.

40. The circuit as claimed in claim 39, wherein said first logic gate and said second logic gate are both logical AND gates.

41. The circuit as claimed in claims 33, wherein said at least two logical gates includes an AND gate receiving an input from said first logic gate and said second logic gate such that a state of a specific bit in said bit pattern is changed if either said first logic gate or said second logic gate is activated.

42. The circuit as claimed in claim 41, wherein said first logic gate and said second logic gate are both logical OR gates.

43. The circuit as claimed in claim 33, wherein said at least two logical gates includes a NAND gate receiving an input from said first logic gate and said second logic gate such that a state of a specific bit in said bit pattern is changed if either said first logic gate or said second logic gate is activated.

44. The circuit as claimed in claim 43, wherein said first logic gate and said second logic gate are both logical NAND gates.

45. The circuit as claimed in claim 33, wherein said at least two logical gates includes a NOR gate receiving an input from said first logic gate and said second logic gate such that a state of a specific bit in said bit pattern is changed if either said first logic gate or said second logic gate is activated.

46. The circuit as claimed in claim 45, wherein said first logic gate and said second logic gate are both logical NOR gates.

47. The circuit as claimed in claim 30 wherein said first logic gate and said second logic gate are both logical AND gates.

48. The circuit as claimed in claim 30, wherein said first logic gate and said second logic gate are both logical OR gates.

49. The circuit as claimed in claim 30, wherein said first logic gate and said second logic gate are both logical NAND gates.

50. The circuit as claimed in claim 30, wherein said first logic gate and said second logic gate are both logical NOR gates.

51. The circuit as claimed in claim 30, wherein said at least two logical gates includes an OR gate receiving an input from said first logic gate and said second logic gate such that a state of a specific bit in said bit pattern is changed if either said first logic gate or said second logic gate is activated.

52. The circuit as claimed in claim 51, wherein said first logic gate and said second logic gate are both logical AND gates.

53. The circuit as claimed in claims 30, wherein said at least two logical gates includes an AND gate receiving an input from said first logic gate and said second logic gate such that a state of a specific bit in said bit pattern is changed if either said first logic gate or said second logic gate is activated.

54. The circuit as claimed in claim 53, wherein said first logic gate and said second logic gate are both logical OR gates.

55. The circuit as claimed in claim 30, wherein said at least two logical gates includes a NAND gate receiving an input from said first logic gate and said second logic gate such that a state of a specific bit in said bit pattern is changed if either said first logic gate or said second logic gate is activated.

56. The circuit as claimed in claim 55, wherein said first logic gate and said second logic gate are both logical NAND gates.

57. The circuit as claimed in claim 30, wherein said at least two logical gates includes a NOR gate receiving an input from said first logic gate and said second logic gate such that a state of a specific bit in said bit pattern is changed if either said first logic gate or said second logic gate is activated.

58. The circuit as claimed in claim 57, wherein said first logic gate and said second logic gate are both logical NOR gates.

* * * * *